455-603 AU 233 EX
FIP8106 XR 3,078,375
CROSS REFERENCE
EXAMINE
Feb. 19, 1963 C. D. HEDGES, JR., ETAL 3,078,375
TRANSISTOR AMPLIFIER UTILIZING A REVERSE-BIASED DIODE FOR BLOCKING SIGNAL LEAKAGE
Filed Feb. 20, 1958
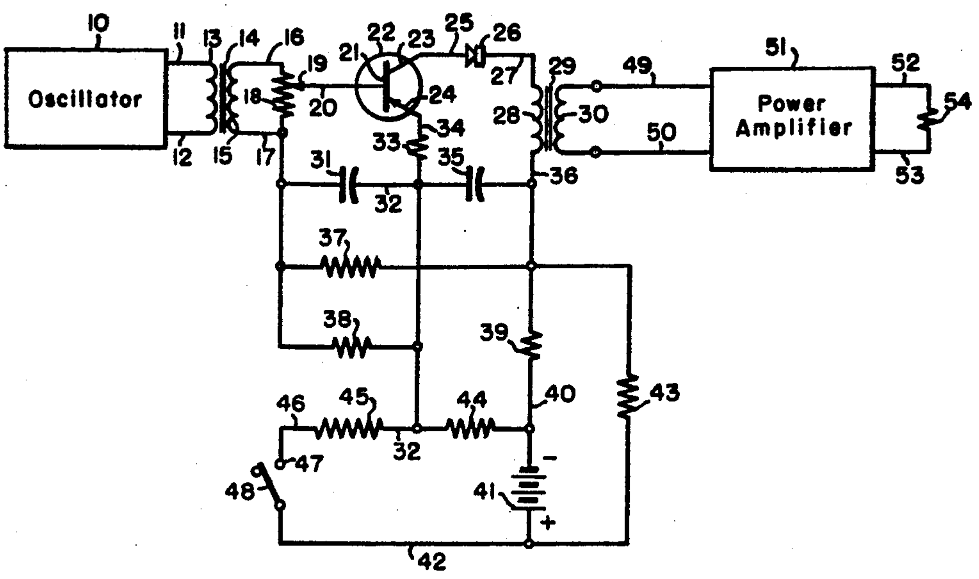
WITNESSES
Edwin E. Basler
James F. Young
INVENTORS
Charles D. Hedges, Jr. &
Ernest E. Scheneman
BY Maury I. Hull
ATTORNEY United States Patent Office 3,078,375

Patented Feb. 19, 1963

3,078,375

TRANSISTOR AMPLIFIER UTILIZING A REVERSE-BIASED DIODE FOR BLOCKING SIGNAL LEAKAGE

Charles D. Hedges, Jr., and Ernest E. Scheneman, Baltimore, Md., assignors to Westinghouse Electric Corporation, East Pittsburgh, Pa., a corporation of Pennsylvania Filed Feb. 20, 1958, Ser. No. 716,333

3 Claims. (Cl. 307—88.5)

230

This invention relates to improvements in blocking circuits, and more particularly to improvements in blocking amplifier circuits employing transistors and suitable for use in carrier equipment intermediate a carrier frequency oscillator and a power amplifier for a modulated or unmodulated signal of carrier frequency.

As is well known in the art to which the invention relates, it is common practice to employ in carrier communication or control apparatus at the transmitter an oscillator for generating a signal of the carrier frequency with separate means for amplifying the generated signal. For relaying applications, the transmitter circuit is normally in a standby condition. This standby condition may be conveniently obtained by interposing between the source of oscillations and a power amplifier a blocking circuit which is designed to block the output of the oscillator while the apparatus is in a standby state and prevent any substantial output from the power amplifier. This blocking is usually accomplished by removing a supply voltage from the intermediate blocking stage, or opening the circuit at a selected point.

In prior art apparatus employing a transistor or transistors in the blocking stage, it is a frequent occurrence that leakage occurs across the transistor, with the result that a certain amount of energy from the oscillator reaches the input of the power amplifier and is amplified, even while the transmitter is in a standby state. This is particularly true as the frequency of the carrier oscillator is increased, the amount of block obtainable in the transistor stage decreasing because the capacity between transistor elements permits the higher frequency signals to leak through in greater amounts. The removal of the supply voltage is ineffective to completely block the circuit for the reason aforementioned that leakage occurs through the capacity of the transistor itself. In prior art apparatus where the circuit of one element of the transistor, for example, the emitter circuit, is opened, the leakage of energy between the other elements of the transistor is still not completely eliminated with the result that blocking is not complete.

The apparatus of the instant invention overcomes these and other disadvantages of the prior art by employing a rectifier in series with one lead from the transistor, for example, in series with the transistor collector, the rectifier being normally biased in a reverse direction while the transmitter is in a standby condition to thereby prevent the leakage of energy through the transistor and rectifier and thence to the power amplifier.

Accordingly, a primary object of the instant invention is to provide a new and improved transistor blocking circuit.

Another object is to provide a new and improved transistor blocking circuit for use in carrier equipment.

A further object is to provide new and improved blocking circuit apparatus in which blocking is substantially complete while the apparatus is in a standby state and no substantial leakage takes place.

Other objects and advantages will become apparent after a study of the following specification when read in connection with the accompanying drawing, in which the single FIGURE thereof is a schematic electrical circuit diagram of the preferred embodiment of the invention.

There is shown at 10, in block form, an oscillator or signal generator of any convenient design for generating a carrier signal of variable frequency of, for example, 30 to 200 kilocycles. The output of the oscillator 10 is supplied by way of leads 11 and 12 to the primary 13 of a transformer 14 having a suitable core and a secondary 15. A voltage or signal from the secondary 15 is applied by way of leads 16 and 17 across a potentiometer 18, the arm 19 of the potentiometer 18 being connected by way of lead 20 to the base 21 of a transistor 22 having, in addition, a collector 23 and emitter 24. The potentiometer 18 provides a means for adjusting the gain of the circuit in a manner well known to those skilled in the art. The transistor 22 may be of the P-N-P type and may be of a type known in the trade as a type 2N43. The collector 23 is connected by way of lead 25 to a rectifier 26 which may be of the crystal-diode type, and the other terminal of the rectifier 26 is connected by way of lead 27 to one terminal of a primary 28 of an output or coupling transformer 29 having a suitable core and a secondary winding 30.

The aforementioned lead 17 is connected by way of capacitor 31, which may have a value of .25 microfarad, lead 32, resistor 33, which may have a value of 100 ohms, and lead 34 to the aforementioned emitter 24. The aforementioned lead 32 is connected by way of capacitor 35 which may have a value of .25 microfarad, and lead 36 to the other terminal of the aforementioned primary winding 28. Lead 17 is further connected by way of resistor 37 to lead 36, resistor 37 having a suitable value of, for example, thirty-three kilohms; lead 17 is further connected by way of resistor 38 to the aforementioned lead 32, resistor 38 having a suitable value of, for example, 330 ohms. The aforementioned lead 36 is connected by way of resistor 39, which may have a value of 100 ohms, and lead 40 to the negative terminal of a suitable battery or other source of direct-current potential 41, the battery 41 providing a potential of, for example, 129 volts and having the positive terminal thereof connected by way of lead 42 and resistor 43 to the aforementioned lead 36. The resistor 43 may have a suitable value of, for example, 10 kilohms. The aforementioned lead 32 is connected by way of a resistor 44, which may have a value of 15 kilohms, to the aforementioned lead 40 and negative terminal of battery 41. Lead 32 is further connected by way of resistor 45, which may have a value of 35 kilohms, and lead 46 to one contact 47 of a single-pole single-throw "carrier start-stop" switch having a switch arm 48 which is connected to the aforementioned lead 42. The switch arm 48 has a "carrier stop" position, which corresponds to the position shown in the drawing, and a "carrier start" position where the arm 48 makes contact with contact 47.

The aforementioned secondary 30 of output transformer 29 is connected by leads 49 and 50 to a suitable power amplifier shown in block form and designated 51. The output of the power amplifier 51 is applied by way of leads 52 and 53 to a load or utilization circuit or coaxial cable, the load being shown here for convenience of illustration as the resistor 54 having, for example, a value of 60 ohms.

In the operation of the above-described apparatus, for convenience of description let it be assumed that the carrier start-stop switch is in the position shown, and let it further be assumed that the oscillator 10 is generating a signal of suitable carrier frequency, for example, 200 kilocycles. It will be noted that the resistor 43 and resistor 39 in series comprise a bleeder circuit which is continuously connected across the battery 41, so that a small voltage drop is developed across resistor 39. The polarity of the voltage drop developed across resistor 39 is such as to make the upper end thereof and lead 36 positive with respect to the lower end thereof and lead 40. By way of resistor 44 and lead 32, this direct-current voltage developed across resistor 39 is applied to the rectifier or crystal diode 26 as an inverse bias voltage. It will be noted that the bias voltage is applied to diode 26 while the carrier start contacts are open and no substantial voltage is applied to the emitter circuit from battery 41. The transistor 22 itself still allows leakage therethrough by reason of capacitive coupling between the base 21 and collector 23, but this leakage signal is greatly attenuated by the diode 26 which is cut off by the bias voltage supplied by the voltage drop across the aforementioned resistor 39. The transistor blocking circuit including the transistor 22 now provides substantially complete blocking, and easily provides sufficient blocking to insure that the signal output from the power amplifier 51 is at least 75 decibels below the unblocked signal condition, which is a typical requirement of satisfactory operation.

While the switch arm 48 of the aforementioned carrier start-stop switch makes contact with 47, transistor 22 is energized from battery 41, and the circuit gain is controlled from potentiometer 18 in accordance with the position of the arm 19.

Resistor 37 provides a very small bias voltage for the base of transistor 22.

Whereas the invention has been shown and described with respect to a preferred embodiment thereof which gives satisfactory results, it should be understood that changes may be made and equivalents substituted without departing from the spirit and scope of the invention.

We claim as our invention:

1. In a transistor blocking circuit for an alternating current signal, in combination, input means having the alternating current signal applied thereto; output means; and circuit means including a transistor, a rectifier, and a source of energizing potential operatively connecting the input means to the output means, one side of said circuit including a series path from base to collector of said transistor and said rectifier, a source of energizing potential for selectively providing transistor operating and non-operating potentials between emitter and base and between said emitter and collector through said rectifier, the potentials between said emitter and said collector for non-operating potentials on said transistor providing a back-bias on said rectifier, and means for simultaneously changing said potentials so that said rectifier is continuously biased in a forward direction while the transistor is energized from said source to amplify said signal, and for simultaneously changing said potentials so that said rectifier is continuously reverse-biased while the transistor is deenergized, the reverse-biased rectifier preventing signal leakage through the inter-element capacitance of the transistor.

2. A signal blocking system for use in a signal translation system adapted to be interposed between a signal source and an amplifier, said blocking system comprising an input upon which a signal is adapted to be impressed, an output, circuit means connecting said input and said output, said circuit means including a transistor having a base, emitter and collector electrodes, a rectifier connected in the collector circuit of said transistor and poled with its forward direction the same as that of the base collector circuit, an energized potential divider network for providing potentials between said emitter and said base and between said emitter and said collector and means for selectively changing the polarity applied to said potential divider, said last mentioned means also changing the potential drop across said potential divider, whereby said rectifier may be continuously biased in a forward direction while the transistor is energized from said potential divider to amplify signals and said rectifier may be continuously reverse-biased when said transistor is deenergized.

3. A signal blocking system for use in a signal translation system adapted to be interposed between a signal source and an amplifier, said blocking system comprising an input upon which a signal is adapted to be impressed, an output, circuit means connecting said input and said output, said circuit means including a transistor having a base, emitter and collector electrodes, a rectifier connected in the collector circuit of said transistor and poled with its forward direction the same as that of the base-collector circuit, an energized potential divider network for supplying potentials for said emitter, base and collector, respective connections between said potential divider network and said emitter, base and collector electrodes, a source of potential for energizing said network, said network comprising a first series circuit including a first resistor and a second resistor connected in series across said source, a potential divider which is connected to said transistor electrodes including third and fourth resistors of higher respective values than said first and second resistors and a fifth resistor having a value intermediate the values of said first and third resistors, said third, fourth and fifth resistors being connected in series across said second resistor, said fifth resistor being adapted to be connected in a second series circuit with said source including a sixth resistor having a value higher than that of said third resistor to thereby reverse the polarity of the potential difference across said potential divider and to simultaneously change the potential drop across the respective points connected to said electrodes, whereby when only said first series circuit is energized said rectifier will be continuously biased in a forward direction while the transistor is energized from said potential divider to amplify said signal and when said second series circuit through said source is energized said rectifier will be continuously reverse-biased while the transistor is deenergized.

References Cited in the file of this patent

UNITED STATES PATENTS

| | | |
|---|---|---|
| 2,011,927 | Chireix | Aug. 20, 1935 |
| 2,832,051 | Raisbeck | Apr. 22, 1958 |
| 2,838,690 | Eckert | June 10, 1958 |
| 2,840,726 | Hamilton | June 24, 1958 |
| 2,866,105 | Eckert | Dec. 23, 1958 |
| 2,987,627 | Eckert | June 6, 1961 |

OTHER REFERENCES

"Transistor Circuitry in Japan," Electronics, July 1956, page 124.